(12) United States Patent
Lee et al.

(10) Patent No.: US 11,916,309 B2
(45) Date of Patent: Feb. 27, 2024

(54) APPARATUS AND METHOD FOR TRANSMITTING AND RECEIVING MAGNETIC FIELD SIGNALS IN MAGNETIC FIELD COMMUNICATION SYSTEM

(71) Applicant: ELECTRONICS AND TELECOMMUNICATIONS RESEARCH INSTITUTE, Daejeon (KR)

(72) Inventors: Jaewoo Lee, Daejeon (KR); In Kui Cho, Daejeon (KR); Sang-Won Kim, Daejeon (KR); Seong-Min Kim, Daejeon (KR); Ho Jin Lee, Daejeon (KR); Jang Yeol Kim, Daejeon (KR); Jung Ick Moon, Daejeon (KR); Woo Cheon Park, Daejeon (KR); Je Hoon Yun, Daejeon (KR); Hyunjoon Lee, Busan (KR); Dong Won Jang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 350 days.

(21) Appl. No.: 17/122,218

(22) Filed: Dec. 15, 2020

(65) Prior Publication Data

US 2021/0194133 A1 Jun. 24, 2021

(30) Foreign Application Priority Data

Dec. 19, 2019 (KR) .......................... 10-2019-0170751

(51) Int. Cl.
*H01Q 7/00* (2006.01)
*G01R 33/36* (2006.01)
(Continued)

(52) U.S. Cl.
CPC .......... *H01Q 7/005* (2013.01); *G01R 33/3692* (2013.01); *H04B 5/0025* (2013.01); *H01Q 1/243* (2013.01)

(58) Field of Classification Search
CPC .......... H01Q 7/005; H01Q 1/243; H01Q 7/00; G01R 33/3692; H04B 5/0025; H04B 5/02; H04B 5/0031; H04B 5/0075
See application file for complete search history.

(56) References Cited

U.S. PATENT DOCUMENTS 2,166,750 A * 7/1939 Carter ................. H01Q 21/205
343/742
4,489,313 A * 12/1984 Pfister ................ G08B 13/2477
340/552

(Continued)

FOREIGN PATENT DOCUMENTS

KR 10-2009-0124246 A 12/2009
KR 10-2012-0134507 A 12/2012
(Continued)

*Primary Examiner* — Hai V Tran
*Assistant Examiner* — Bamidele A Immanuel
(74) *Attorney, Agent, or Firm* — LRK PATENT LAW FIRM

(57) ABSTRACT

An apparatus and method for transmitting and receiving magnetic field signals in a magnetic field communication system are provided. The apparatus includes a controller configured to generate a communication signal, matching units that are configured to receive the communication signal and that respectively correspond to different matching frequencies, and loop antennas that are connected to the matching units, respectively, and that are configured to convert communication signals according to the different matching frequencies into magnetic transmission signals in the form of magnetic field energy and to transmit the magnetic transmission signals.

7 Claims, 6 Drawing Sheets

(51) Int. Cl.
*H04B 5/00* (2006.01)
*H01Q 1/24* (2006.01)

(56) References Cited

U.S. PATENT DOCUMENTS

| | | | | |
|---|---|---|---|---|
| 4,675,658 A * | 6/1987 | Anderson | .......... | G08B 13/2488 340/572.5 |
| 4,736,196 A * | 4/1988 | McMahon | ............ | G08B 21/22 455/100 |
| 5,661,457 A * | 8/1997 | Ghaffari | ............ | G08B 13/2488 342/417 |
| 5,708,423 A * | 1/1998 | Ghaffari | ............ | G08B 13/2471 340/5.8 |
| 6,057,803 A * | 5/2000 | Kane | .......... | H01Q 1/32 343/742 |
| 6,407,702 B1 * | 6/2002 | Bergman | ................ | G01S 3/143 342/417 |
| 7,525,413 B2 | 4/2009 | Jung et al. | | |
| 2003/0174099 A1 * | 9/2003 | Bauer | ................ | G06K 7/10336 343/893 |
| 2004/0104843 A1 * | 6/2004 | Mimura | ............... | H04B 17/318 342/362 |
| 2005/0134519 A1 * | 6/2005 | Fukano | ............... | G06K 7/10336 343/742 |
| 2005/0141470 A1 * | 6/2005 | Jung | ................ | H04W 52/0225 370/338 |
| 2005/0179604 A1 * | 8/2005 | Liu | ........................ | H01Q 5/385 343/742 |
| 2008/0299904 A1 * | 12/2008 | Yi | ............................ | H01Q 7/06 455/41.1 |
| 2009/0224724 A1 | 9/2009 | Ma et al. | | |
| 2013/0119134 A1 * | 5/2013 | Tramoni | ............ | G06K 19/0726 361/270 |
| 2014/0051352 A1 * | 2/2014 | Wolfe | ..................... | H04B 13/02 455/40 |
| 2014/0153491 A1 * | 6/2014 | Lee | ........................ | H02J 50/20 307/104 |
| 2014/0154980 A1 * | 6/2014 | Jang | ...................... | H04B 5/0031 455/41.1 |
| 2014/0314129 A1 * | 10/2014 | Roper | ..................... | H01Q 7/00 343/867 |
| 2015/0180542 A1 * | 6/2015 | Jang | ...................... | H04B 5/0081 455/41.1 |
| 2015/0214621 A1 * | 7/2015 | Kim | ........................ | H01Q 1/26 343/701 |
| 2015/0323694 A1 * | 11/2015 | Roy | ........................ | H02J 50/12 307/104 |
| 2016/0148752 A1 * | 5/2016 | Moon | .................. | H04B 5/0087 343/867 |
| 2016/0203472 A1 * | 7/2016 | Wallner | ............... | H04B 5/0056 705/41 |
| 2016/0308587 A1 * | 10/2016 | Lee | ........................ | H04B 5/0056 |
| 2016/0322850 A1 * | 11/2016 | Yeh | ........................ | H02J 50/00 |
| 2016/0380365 A1 * | 12/2016 | Helbers | .................. | H04B 5/02 455/73 |
| 2017/0047636 A1 * | 2/2017 | Lee | ........................ | H01Q 5/321 |
| 2017/0162952 A1 * | 6/2017 | Zeng | ...................... | H01Q 21/30 |
| 2017/0187471 A1 * | 6/2017 | Roper | ..................... | H04B 5/0056 |
| 2017/0271926 A1 * | 9/2017 | Plekhanov | ............... | H01Q 7/00 |
| 2018/0309188 A1 * | 10/2018 | Jeon | ...................... | H01Q 1/2283 |
| 2019/0252794 A1 * | 8/2019 | Saito | .................... | H01Q 19/185 |
| 2019/0260118 A1 * | 8/2019 | Moon | ...................... | H01Q 7/00 |
| 2019/0363584 A1 * | 11/2019 | Leem | ..................... | G06K 19/06 |
| 2020/0203852 A1 * | 6/2020 | Saitou | .................... | H01Q 21/06 |

FOREIGN PATENT DOCUMENTS

| | | |
|---|---|---|
| KR | 10-2016-0001816 A | 1/2016 |
| WO | 2013/012111 A1 | 1/2013 |
| WO | 2018/093041 A1 | 5/2018 |

* cited by examiner

APPARATUS AND METHOD FOR TRANSMITTING AND RECEIVING MAGNETIC FIELD SIGNALS IN MAGNETIC FIELD COMMUNICATION SYSTEM

CROSS-REFERENCE TO RELATED APPLICATION(S)

This application claims the benefit of Korean Patent Application No. 10-2019-0170751 filed on Dec. 19, 2019, in the Korean Intellectual Property Office, the disclosure of which is incorporated herein by reference for all purposes.

BACKGROUND

1. Field of the Invention

One or more example embodiments relate to an apparatus and method for transmitting and receiving magnetic field signals in a magnetic field communication system, and more particularly, to an apparatus for transmitting and receiving magnetic field signals, which includes a multi-loop antenna and a magnetic field detector, and a method of transmitting and receiving magnetic field signals.

2. Description of Related Art

In an electric field, a permittivity greatly changes depending on a medium of a communication channel. On the contrary, since a magnetic field has an almost constant permeability in media except for magnetic materials, the magnetic field enables wireless communication even in special environments such as in water, under the ground, or inside a building, under near field conditions.

An electric field communication system has a difficulty in performing stable communication due to signal attenuation and interference in an environment in which objects affecting communication such as water, soil or high molecular materials exist, due to a characteristic of a permittivity of a communication channel (medium environment).

Also, a conventional magnetic field communication system performs magnetic field communication using a loop antenna for transmission including a single matching unit. However, the conventional magnetic field communication system has a difficulty in configuration of a wideband due to a matching effect of carrier wave frequencies. If the number of turns of a circular loop is increased to increase a magnetic field, an internal resistance value of an antenna is also proportionally increased, which may lead to a restriction on generation of a high magnetic field due to an impedance difference between a transmission driver and a current amplifier.

Also, since a common antenna for transmission and reception is used in the conventional magnetic field communication system, it is impossible to detect a minute signal.

Therefore, there is a demand for a method of detecting even a minute signal while transmitting a signal using a wide bandwidth in a magnetic field communication system.

SUMMARY

An aspect provides an apparatus and method for transmitting and receiving magnetic field signals, which may widen a communicable range of a magnetic field communication system.

Another aspect also provides an apparatus and method for transmitting and receiving magnetic field signals, which may increase a reception efficiency of a magnetic reception signal.

According to an aspect, there is provided a magnetic field transceiver including a controller configured to generate a communication signal, matching units configured to receive the communication signal, the matching units respectively corresponding to different matching frequencies, and loop antennas configured to convert communication signals according to the different matching frequencies into magnetic transmission signals in a form of magnetic field energy and to transmit the magnetic transmission signals, the loop antennas being respectively connected to the matching units.

The magnetic field transceiver may further include a transmission driver configured to modulate and amplify the communication signal, and the matching units may be configured to receive the modulated and amplified communication signal.

The loop antennas may be horizontally arranged based on a direction in which another magnetic field transceiver is located, and the magnetic transmission signals may be signals in the form of magnetic field energy to be transmitted to the other magnetic field transceiver by sequentially passing through the loop antennas.

The loop antennas may be vertically arranged based on a direction in which another magnetic field transceiver is located, and may be configured to generate a magnetic field passing through the loop antennas based on the communication signal and to transfer the magnetic transmission signals to the other magnetic field transceiver.

The magnetic field transceiver may further include a magnetic field detector configured to receive a magnetic reception signal from another magnetic field transceiver, and a reception sensor configured to demodulate a communication signal generated by the other magnetic field transceiver from the magnetic reception signal.

The controller may be configured to process the demodulated communication signal and to generate a communication signal to be transferred to the other magnetic field transceiver according to a processing result.

According to another aspect, there is provided a magnetic field transceiver including a receiver configured to receive a magnetic reception signal from another magnetic field transceiver using a magnetic field detector and to demodulate the magnetic reception signal, a controller configured to process a demodulated communication signal and to generate a communication signal to be transferred to the other magnetic field transceiver according to a processing result, and a transmitter configured to convert the communication signal into a magnetic transmission signal in a form of magnetic field energy and to transmit the magnetic transmission signal, using a plurality of loop antennas.

The transmitter may include matching units configured to receive the communication signal, the matching units corresponding to different matching frequencies, and the loop antennas configured to convert the communication signal according to the different matching frequencies into the magnetic transmission signal in the form of magnetic field energy and to transmit the magnetic transmission signal, the loop antennas being respectively connected to the matching units.

The loop antennas may be horizontally arranged based on a direction in which another magnetic field transceiver is located, and the magnetic transmission signal may be a signal in the form of magnetic field energy to be transmitted to the other magnetic field transceiver by sequentially passing through the loop antennas.

The loop antennas may be vertically arranged based on a direction in which another magnetic field transceiver is located, and may be configured to generate a magnetic field passing through the loop antennas based on the communication signal and to transfer the magnetic transmission signal to the other magnetic field transceiver.

According to another aspect, there is provided a method of transmitting a magnetic field signal, which includes inputting a communication signal to matching units respectively corresponding to different matching frequencies, and converting, using a plurality of loop antennas respectively connected to the matching units, communication signals according to the different matching frequencies into magnetic transmission signals in a form of magnetic field energy and transmitting the magnetic transmission signals.

The converting may include converting the communication signals into magnetic transmission signals in a form of magnetic field energy to be transmitted to another magnetic field transceiver by sequentially passing through loop antennas that are horizontally arranged based on a direction in which the other magnetic field transceiver is located.

The converting may include generating a magnetic field passing through loop antennas that are vertically arranged based on a direction in which another magnetic field transceiver is located, based on the communication signal, and transferring the magnetic transmission signals to the other magnetic field transceiver.

The method may further include receiving a magnetic reception signal from another magnetic field transceiver, using a magnetic field detector, and demodulating a communication signal generated by the other magnetic field transceiver from the magnetic reception signal.

According to another aspect, there is provided a magnetic field communication method performed by a magnetic field transceiver in a magnetic field communication system. The magnetic field communication method may include receiving a magnetic reception signal from another magnetic field transceiver, using a magnetic field detector, and demodulating the magnetic reception signal, processing a demodulated communication signal and generating a communication signal to be transferred to the other magnetic field transceiver according to a processing result, and converting the communication signal into a magnetic transmission signal in a form of magnetic field energy and transmitting the magnetic transmission signal, using a plurality of loop antennas.

The converting may include inputting the communication signal to matching units respectively corresponding to different matching frequencies, and converting, using a plurality of loop antennas respectively connected to the matching units, communication signals according to the different matching frequencies into magnetic transmission signals in a form of magnetic field energy and transmitting the magnetic transmission signals.

The converting may include converting the communication signal into a magnetic transmission signal in a form of magnetic field energy to be transmitted to another magnetic field transceiver by sequentially passing through loop antennas that are horizontally arranged based on a direction in which the other magnetic field transceiver is located.

The converting may include generating a magnetic field passing through loop antennas that are vertically arranged based on a direction in which another magnetic field transceiver is located, based on the communication signal, and transferring the magnetic transmission signal to the other magnetic field transceiver.

Additional aspects of example embodiments will be set forth in part in the description which follows and, in part, will be apparent from the description, or may be learned by practice of the disclosure.

According to example embodiments, it is possible to widen a communicable range of a magnetic field communication system by increasing a magnitude of current applied to loop antennas using a plurality of different matching units.

Also, according to example embodiments, it is possible to increase an efficiency of reception of a magnetic reception signal by receiving the magnetic reception signal using a high-sensitivity magnetic field detector.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
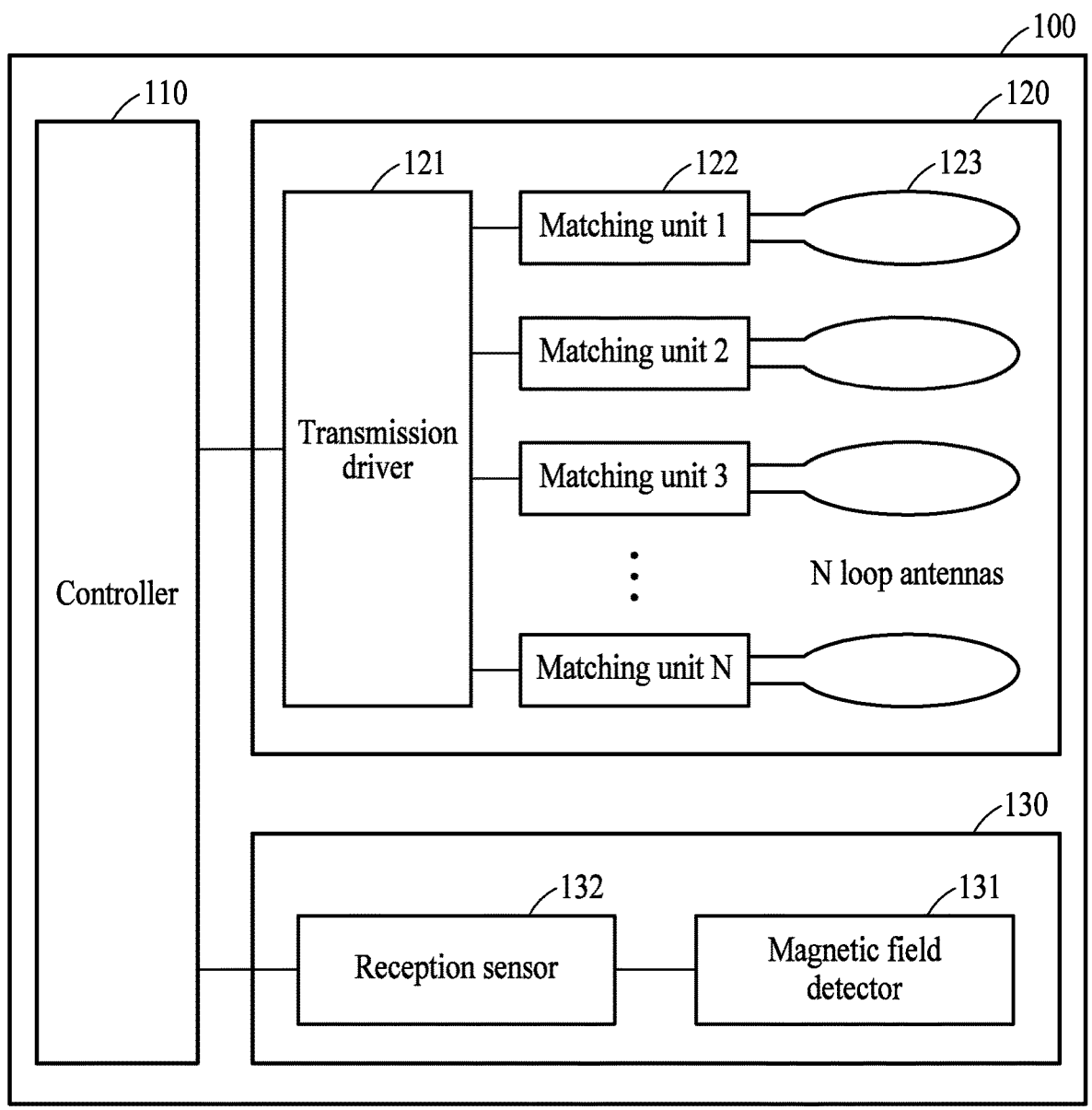
FIG. 1 is a diagram illustrating an example of a magnetic field transceiver according to an example embodiment.

Hereinafter, example embodiments will be described in detail with reference to the accompanying drawings. Various modifications may be made to example embodiments. However, it should be understood that these embodiments are not construed as limited to the illustrated forms and include all changes, equivalents or alternatives within the idea and the technical scope of this disclosure.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

FIG. 1 is a diagram illustrating an apparatus for transmitting and receiving magnetic field signals according to an example embodiment. In the present specification, an apparatus for transmitting and receiving magnetic field signals may be referred to as a "magnetic field transceiver".

A magnetic field transceiver 100 may be a transceiver in a magnetic field communication system that performs a magnetic field communication in a near field region, and may include a controller 110, a transmitter 120, and a receiver 130. A near field condition is a case in which a product of a wave number vector and a distance is less than "1" ($k_r \ll 1$). In this case, k denotes a wave number vector of a communication carrier frequency, and r denotes a distance from a signal source to a measurement point. Also, in the near field condition, a strength of a magnetic field of a loop antenna may be proportional to a current applied by a Biot-Savart law, a cross-sectional area of the loop antenna, and the number of turns of the loop antenna.

The controller 110 may generate a communication signal to be transmitted to another magnetic field transceiver included in the magnetic field communication system, in response to an input of a user or a reception of a communication signal from the other magnetic field transceiver.

The transmitter 120 may be a multi-loop antenna-based broadband high magnetic field transmitter with different matching frequencies.

The transmitter 120 may include a transmission driver 121, a plurality of matching units 122, and a plurality of loop antennas 123.

The transmission driver 121 may modulate and amplify the communication signal generated by the controller 110 and may transfer the communication signal to the matching units 122.

The matching units 122 may respectively correspond to different matching frequencies, and may receive the communication signal that is modulated and amplified by the transmission driver 121. Depending on examples, the matching units 122 may also receive the communication signal generated by the controller 110.

The loop antennas 123 may be connected to the matching units 122, respectively. Also, the loop antennas 123 may convert communication signals based on different matching frequencies into magnetic transmission signals in the form of magnetic field energy, and may transmit the magnetic transmission signals.

In an example, the loop antennas 123 may be horizontally arranged based on a direction in which another magnetic field transceiver is located. The magnetic transmission signals obtained by converting the communication signals by the loop antennas 123 may be signals in the form of magnetic field energy which are transmitted to the other magnetic field transceiver by sequentially passing through the loop antennas 123.

In another example, the loop antennas 123 may be vertically arranged based on a direction in which another magnetic field transceiver is located. In this example, the loop antennas 123 may generate a magnetic field passing through the loop antennas 123 based on the communication signal and may transfer the magnetic transmission signals to the other magnetic field transceiver.

The receiver 130 may receive a magnetic reception signal that is obtained by modulating a magnetic transmission signal transmitted by the other magnetic field transceiver while passing through a channel. For example, the receiver 130 may be a high-sensitivity receiver.

The receiver 130 may include a magnetic field detector 131 and a reception sensor 132.

The magnetic field detector 131 may receive a magnetic reception signal from the other magnetic field transceiver. For example, the magnetic field detector 131 may measure a magnetic field generated in loop antennas of the other magnetic field transceiver, and may detect a magnetic reception signal from the measured magnetic field.

The reception sensor 132 may demodulate a communication signal generated by the other magnetic field transceiver from the magnetic reception signal received by the magnetic field detector 131, and may transfer the communication signal to the controller 110. The controller 110 may process the communication signal demodulated by the reception sensor 132. Also, the controller 110 may generate a communication signal to be transferred to the other magnetic field transceiver according to a processing result, and may transfer the communication signal to the transmitter 120.

The magnetic field transceiver 100 may increase a magnitude of current applied to the loop antennas 123 using the matching units 122, and thus it is possible to widen a communicable range of the magnetic field communication system.

Also, the magnetic field transceiver 100 may receive a magnetic reception signal using a high-sensitivity magnetic field detector, and thus it is possible to increase an efficiency of reception of the magnetic reception signal.

Figure 2:
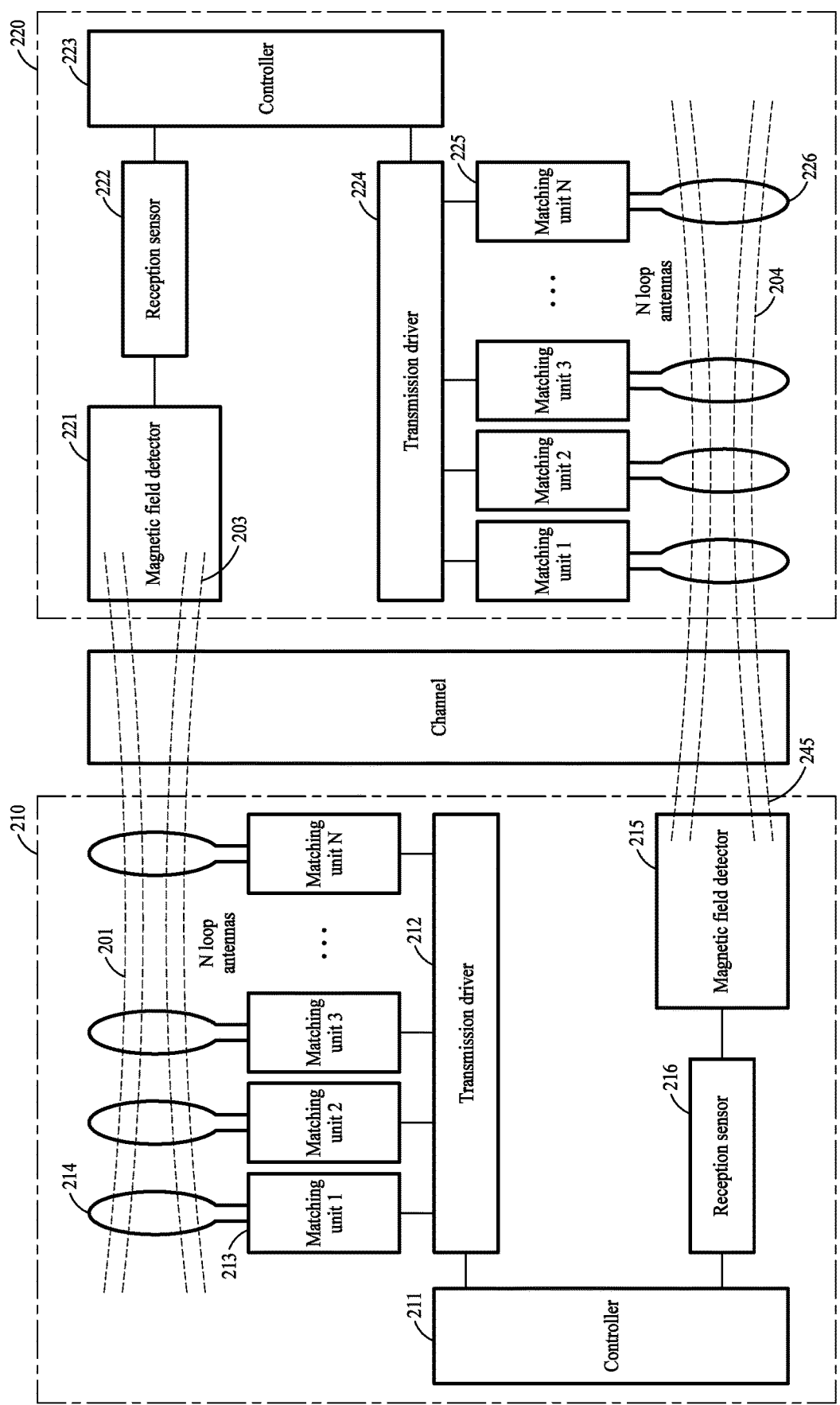
FIG. 2 is a diagram illustrating an operation of a magnetic field transceiver according to an example embodiment.

FIG. 2 is a diagram illustrating operations of magnetic field transceivers according to an example embodiment.

Referring to FIG. 2, a magnetic field communication system may include a first magnetic field transceiver 210, a second magnetic field transceiver 220, and a channel. Although two magnetic field transceivers are included in the magnetic field communication system as shown in FIG. 2, at least three magnetic field transceivers may be included in the magnetic field communication system depending on example embodiments.

A controller 211 of the first magnetic field transceiver 210 may generate a communication signal to be transmitted to the second magnetic field transceiver 220, and may transfer the communication signal to a transmission driver 212. The transmission driver 212 may modulate and amplify the received communication signal and may transfer the communication signal to "N" matching units 213. The communication signal transferred to the matching units 213 may be converted into a magnetic transmission signal 201 in the form of magnetic field energy in "N" loop antennas 214. The magnetic transmission signal 201 may be modulated to a magnetic reception signal 203 by passing through the channel.

A magnetic field detector 221 of the second magnetic field transceiver 220 may receive the magnetic reception signal 203 and may transfer the magnetic reception signal 203 to a reception sensor 222. The reception sensor 222 may demodulate the communication signal generated by the controller 211 of the first magnetic field transceiver 210 from the received magnetic reception signal 203, and may transfer the demodulated communication signal to a controller 223. The controller 223 may perform a control operation based on the received communication signal, or may process the communication signal.

Also, the controller 223 of the second magnetic field transceiver 220 may generate a communication signal to be transmitted to the first magnetic field transceiver 210, and may transfer the communication signal to a transmission driver 224. The communication signal to be transmitted to the first magnetic field transceiver 210 may be generated based on the communication signal received by the controller 223 from the reception sensor 222, or an operation according to the communication signal.

The transmission driver 224 may modulate and amplify the received communication signal and may transfer the communication signal to "N" matching units 225. The communication signal transferred to the matching units 225 may be converted into a magnetic transmission signal 204 in the form of magnetic field energy in "N" loop antennas 226. The magnetic transmission signal 204 may be modulated to a magnetic reception signal 205 by passing through the channel.

A magnetic field detector 215 of the first magnetic field transceiver 210 may receive the magnetic reception signal 205 and may transfer the magnetic reception signal 205 to a reception sensor 216. The reception sensor 216 may demodulate the communication signal generated by the controller 223 of the second magnetic field transceiver 220 from the received magnetic reception signal 205, and may transfer the demodulated communication signal to the controller 211. The controller 211 may perform a control operation based on the received communication signal, or may process the communication signal. Also, the controller 211 may generate a communication signal to be transmitted to the second magnetic field transceiver 220 based on the communication signal received from the reception sensor 216 or an operation according to the communication signal.

Figure 3:
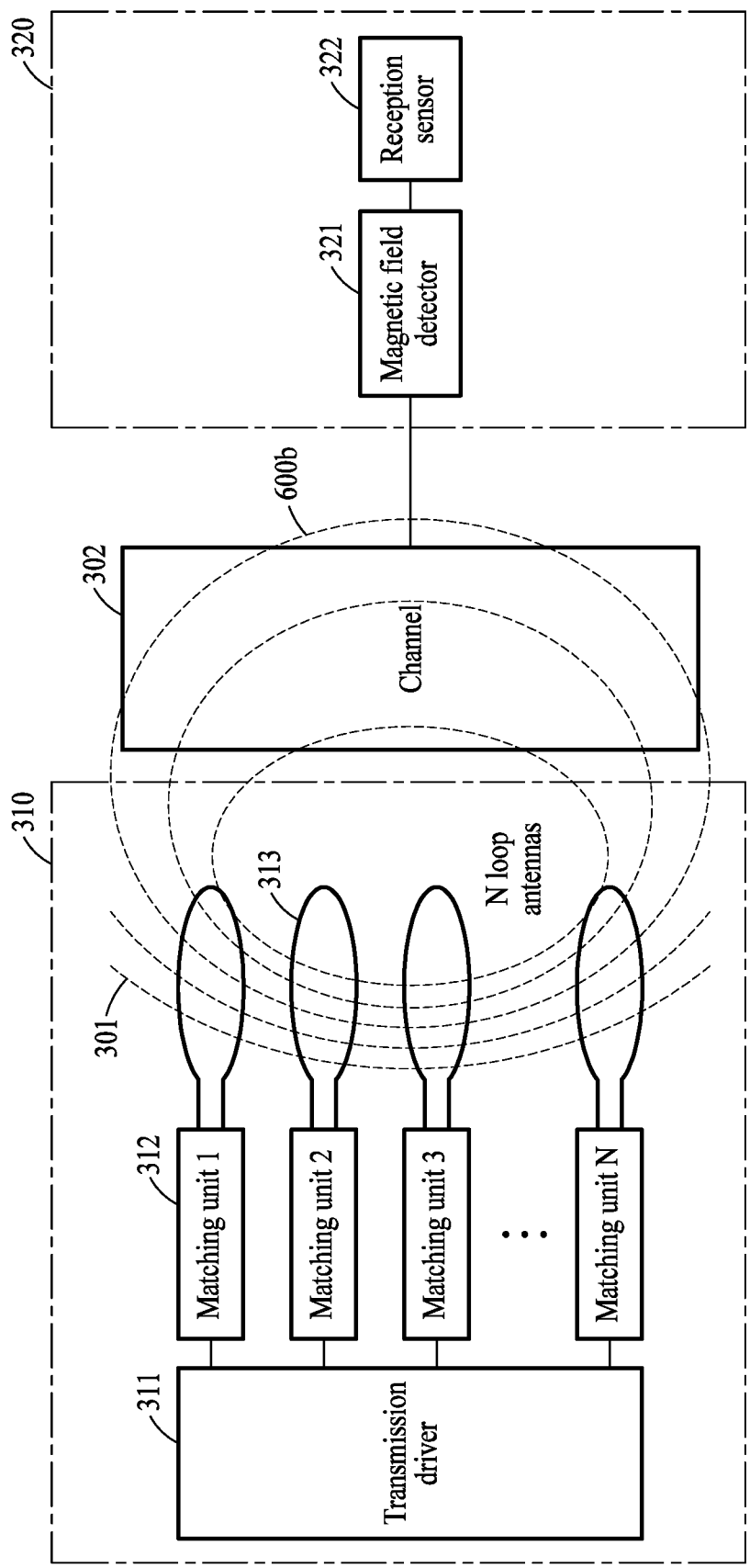
FIG. 3 is a diagram illustrating another example of a magnetic field transceiver according to an example embodiment.

FIG. 3 is a diagram illustrating a magnetic field transceiver according to an example embodiment.

As shown in FIG. 3, a magnetic field transceiver 310 may include loop antennas 313 that are vertically arranged based on a direction in which a magnetic field transceiver 320 is located. A transmission driver 311 may modulate and amplify a communication signal received from a controller of the magnetic field transceiver 310 and may transfer the communication signal to "N" matching units 312. Also, "N" loop antennas 313 may generate a magnetic field 301 passing through the loop antennas 313 based on the communication signal received by the matching units 312. Here, a magnetic transmission signal corresponding to the magnetic field 301 may be modulated to a magnetic reception signal 303 by passing through a channel 302. Also, a magnetic field detector 321 of the magnetic field transceiver 320 may receive the magnetic reception signal 303 and may transfer the magnetic reception signal 303 to a reception sensor 322. The reception sensor 322 may demodulate a communication signal generated by the controller of the magnetic field transceiver 310 from the received magnetic reception signal 303.

Figure 4:
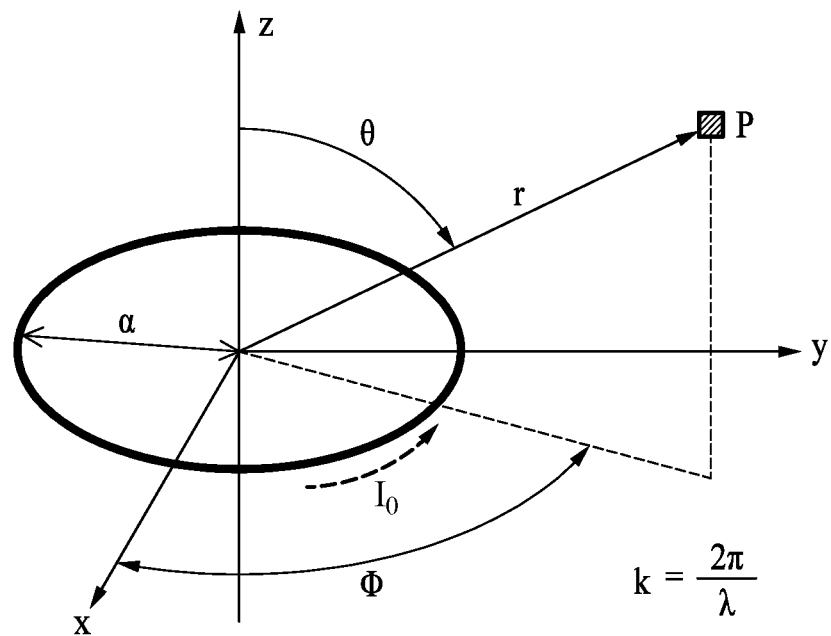
FIG. 4 is a diagram illustrating a magnetic field generated by current of loop antennas in a magnetic field transceiver according to an example embodiment.

FIG. 4 illustrates a magnetic field strength at a point P by current $I_0$ of a circular loop antenna with a radius a and a single turn in the magnetic field transceiver 100.

In FIG. 4, the magnetic field strength at the point P of the circular loop antenna in a cartesian coordinate system (x, y, z) is represented by a spherical coordinate system (r, Φ, θ). Also, a numerical formula model based on the spherical coordinate system at the point P of FIG. 4 may be expressed as shown in Equations 1 through 3 below.

$$H_r = j\frac{ka^2 I_0 \cos\theta}{2r^2}\left[1 + \frac{1}{jkr}\right]e^{-jkr} \qquad \text{[Equation 1]}$$

In Equation 1, $H_r$ denotes an r-direction magnetic field at the point P, and k denotes a wave number vector. Also, a denotes a radius of a circular loop antenna, $I_0$ denotes current, and r denotes a distance from a coordinate axis origin to the point P.

$$H_\phi = 0 \qquad \text{[Equation 2]}$$

In Equation 2, $H_\Phi$ denotes a Φ-direction magnetic field at the point P.

$$H_\theta = -\frac{(ka)^2 I_0 \sin\theta}{4r}\left[1 + \frac{1}{jkr} - \frac{1}{(kr)^2}\right]e^{-jkr} \qquad \text{[Equation 3]}$$

In Equation 3, $H_\theta$ denotes a θ-direction magnetic field at the point P.

For example, a magnetic field strength $|H_r|$, $|H_\theta|$ at the point P may be represented based on Equations 1 through 3. In this example, the magnetic field strength $|H_r|$, $|H_\theta|$ may be proportional to the number N of turns of a circular loop, the current $I_0$, and a cross-sectional area S, and may be inversely proportional to $r^3$ under a condition of 0<θ<90°, as shown in Equation 4 below.

$$|H_r|, |H_\theta| \propto \frac{NI_0 S}{r^3} \qquad \text{[Equation 4]}$$

Figure 5:
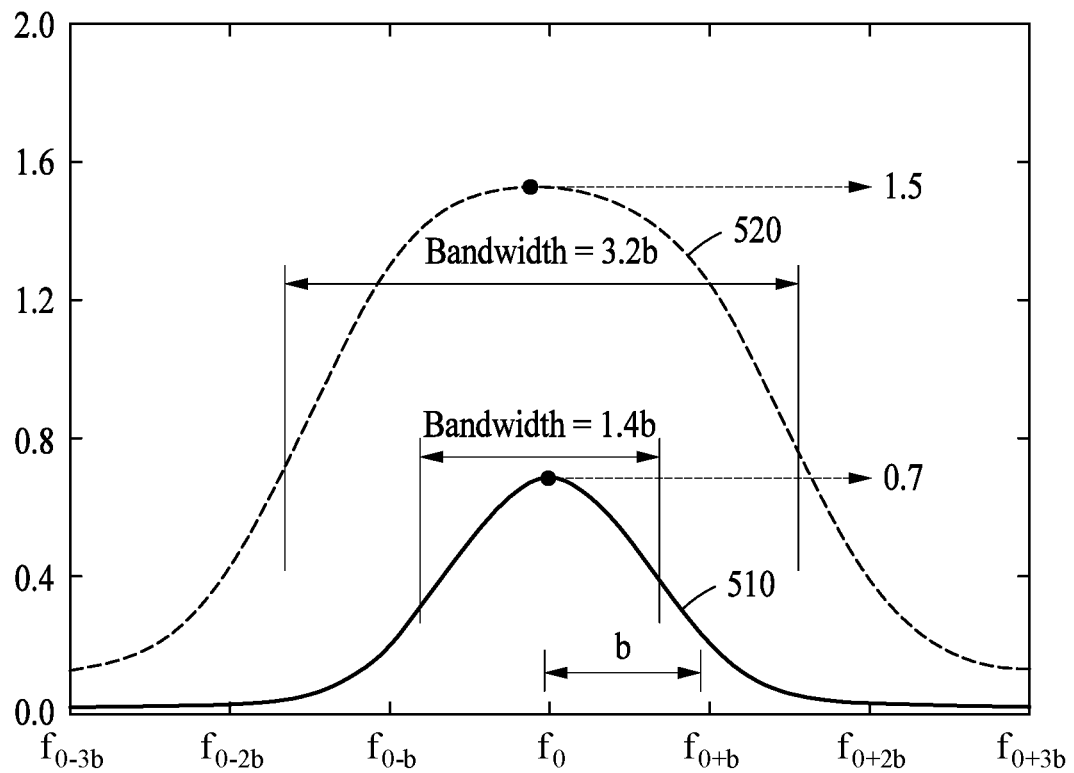
FIG. 5 is a diagram illustrating an example of a bandwidth and an output characteristic of a magnetic field transceiver according to an example embodiment.

FIG. 5 illustrates current 510 applied to a loop antenna of a conventional magnetic field transceiver in a condition of a frequency interval of "b" based on a carrier frequency $f_0$ of a matching condition, and current 520 applied to the loop antennas 123 of the magnetic field transceiver 100 of FIG. 1. In a graph of FIG. 5, a vertical axis represents a magnitude of normalized current.

Also, the loop antenna of the conventional magnetic field transceiver may be a single loop antenna with N turns, and the loop antennas 123 of the magnetic field transceiver 100 may be three loop antennas with "N/3" turns at three matching frequencies $f_{0-b}$, $f_0$, and $f_{0+b}$.

As shown in FIG. 5, in the magnetic field transceiver 100, a bandwidth may be increased 2.29 times that of the loop antenna of the conventional magnetic field transceiver, and current may be increased 2.1 times that of the loop antenna of the conventional magnetic field transceiver.

Figure 6:
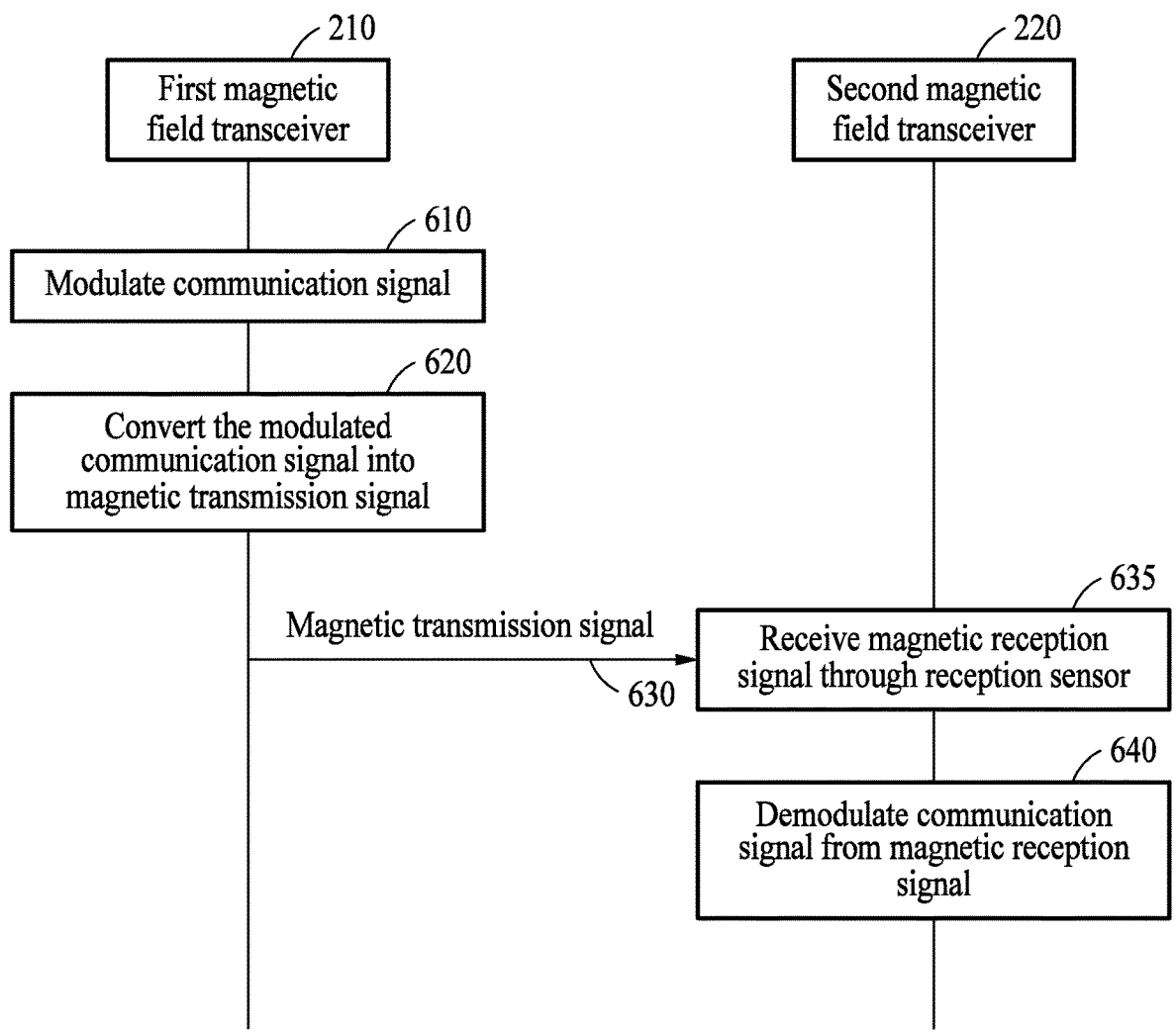
FIG. 6 is a diagram illustrating a method of transmitting and receiving magnetic field signals according to an example embodiment.

FIG. 6 is a diagram illustrating a method of transmitting and receiving magnetic field signals according to an example embodiment.

In operation 610, the controller 211 of the first magnetic field transceiver 210 may generate a communication signal to be transmitted to the second magnetic field transceiver 220, and may transfer the communication signal to the transmission driver 212. Here, the transmission driver 212 may modulate and amplify the received communication signal, and may transmit the communication signal to the matching units 213 respectively corresponding to different matching frequencies.

In operation 620, the "N" loop antennas 214 that are respectively connected to the matching units 213 may convert the communication signal modulated by the transmission driver 212 into a magnetic transmission signal in the form of magnetic field energy. The "N" loop antennas 214 may receive communication signals according to different matching frequencies based on the connected matching units 213 and may convert the communication signals into magnetic transmission signals.

In operation 630, the "N" loop antennas 214 may transmit the magnetic transmission signal 201 obtained in operation 620 through a channel to the second magnetic field transceiver 220. The magnetic transmission signal 201 may be modulated to the magnetic reception signal 203 by passing through the channel. In operation 635, the magnetic field detector 221 of the second magnetic field transceiver 220 may receive the magnetic reception signal 203 and may transfer the magnetic reception signal 203 to the reception sensor 222.

In operation 640, the reception sensor 222 may demodulate the communication signal generated by the controller 211 of the first magnetic field transceiver 210 from the magnetic reception signal 203 received in operation 635. The controller 223 of the second magnetic field transceiver 220 may perform a control operation based on the received communication signal, or may process the communication signal.

The apparatus and method for transmitting and receiving magnetic field signals according to example embodiments may be embodied as a program that is executable by a computer and may be implemented as various recording media such as a magnetic storage medium, an optical reading medium, and a digital storage medium.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

Various techniques described herein may be implemented in digital electronic circuitry, or in computer hardware, firmware, software, or in combinations thereof. The techniques may be implemented as a computer program product, i.e., a computer program tangibly embodied in a machine-readable storage device (for example, a computer-readable medium) or in a propagated signal, for processing by, or to control an operation of, a data processing apparatus, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or on multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductor memory devices, e.g., magnetic media such as hard disks, floppy disks, and magnetic tape, optical media such as a compact disk read-only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include all computer storage media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above-described example embodiments in all example embodiments, and it should be understood that the above-described program components and apparatuses may be incorporated into a single software product or may be packaged in multiple software products.

It should be understood that example embodiments disclosed herein are merely illustrative and are not intended to limit the scope of the disclosure. It will be apparent to those skilled in the art that various modifications of the example embodiments may be made without departing from the spirit and scope of the claims and their equivalents.

What is claimed is:

1. A magnetic field transceiver in a magnetic field communication system, the magnetic field transceiver comprising:
a controller configured to generate communication signals;
matching units configured to receive the communication signals, the matching units respectively corresponding to different matching frequencies; and
loop antennas configured to convert communication signals according to the different matching frequencies into magnetic transmission signals in a form of magnetic field energy and to transmit the magnetic transmission signals, the loop antennas being respectively connected to the matching units, wherein each of the loop antennas has a number of turns equal to: number of turns needed to generate a desired magnetic field/number of loop antennas, wherein the matching units comprising a first matching unit, a second matching unit and an N matching unit, wherein the loop antennas are horizontally arranged based on a direction in which another magnetic field transceiver is located, and wherein the magnetic transmission signals are signals in the form of magnetic field energy which is transmitted to the other magnetic field transceiver by sequentially passing through the loop antenna connected to the first matching unit to the loop antenna connected to the second matching unit to the loop antenna connected to the N matching unit.

2. The magnetic field transceiver of claim 1, further comprising:

a transmission driver configured to modulate and amplify the communication signals, wherein the matching units are configured to receive the modulated and amplified communication signals.

3. The magnetic field transceiver of claim 1, further comprising:

a magnetic field detector configured to receive magnetic reception signals from another magnetic field transceiver; and a reception sensor configured to demodulate communication signals generated by the other magnetic field transceiver from the magnetic reception signal.

4. The magnetic field transceiver of claim 3, wherein the controller is configured to process the demodulated communication signals and to generate communication signal to be transferred to the other magnetic field transceiver according to a processing result.

5. A magnetic field transceiver in a magnetic field communication system, the magnetic field transceiver comprising:

a controller configured to generate communication signals;

matching units configured to receive the communication signals, the matching units respectively corresponding to different matching frequencies; and loop antennas configured to convert communication signals according to the different matching frequencies into magnetic transmission signals in a form of magnetic field energy and to transmit the magnetic transmission signals, the loop antennas being respectively connected to the matching units, wherein each of the loop antennas has a number of turns equal to: number of turns needed to generate a desired magnetic field/number of loop antennas, wherein the matching units comprising a first matching unit, a second matching unit and an N matching unit, wherein the loop antennas are vertically arranged based on a direction in which another magnetic field transceiver is located, and is configured to generate a magnetic field passing the loop antenna connected to the first matching unit to the loop antenna connected to the second matching unit to the loop antenna connected to the N matching unit based on the communication signals and to transfer the magnetic transmission signals to the other magnetic field transceiver.

6. A method of transmitting a magnetic field signal, the method comprising:

inputting communication signals to matching units respectively corresponding to different matching frequencies; and converting, using a plurality of loop antennas respectively connected to the matching units, communication signals according to the different matching frequencies into magnetic transmission signals in a form of magnetic field energy and transmitting the magnetic transmission signals, wherein each of the loop antennas has a number of turns equal to: number of turns needed to generate a desired magnetic field/number of loop antennas, wherein the matching units comprising a first matching unit, a second matching unit and an N matching unit, wherein the loop antennas are horizontally arranged based on a direction in which another magnetic field transceiver is located, and wherein the converting comprises converting the communication signals into magnetic transmission signals in a form of magnetic field energy which is transmitted to another magnetic field transceiver by sequentially passing through the loop antenna connected to the first matching unit to the loop antenna connected to the second matching unit to the loop antenna connected to the N matching unit.

7. The method of claim 6, further comprising:

receiving magnetic reception signals from another magnetic field transceiver, using a magnetic field detector; and demodulating communication signals generated by the other magnetic field transceiver from the magnetic reception signal.

* * * * *